United States Patent [19]

Aboelfotoh et al.

[11] Patent Number: 4,888,297
[45] Date of Patent: Dec. 19, 1989

[54] PROCESS FOR MAKING A CONTACT STRUCTURE INCLUDING POLYSILICON AND METAL ALLOYS

[75] Inventors: Mohamed O. Aboelfotoh, Poughkeepsie; Yuk L. Tsang, Kingston, both of N.Y.

[73] Assignee: International Business Machines Corporation, Armonk, N.Y.

[21] Appl. No.: 110,996

[22] Filed: Oct. 20, 1987

Related U.S. Application Data

[62] Division of Ser. No. 419,677, Sep. 20, 1982, abandoned.

[51] Int. Cl.[4] ............... H01L 21/225; H01L 21/283
[52] U.S. Cl. .................................. 437/41; 437/192; 437/193; 437/162; 437/246; 437/984; 148/DIG. 20
[58] Field of Search ............... 437/200, 193, 40, 41, 437/42, 43, 44, 45, 192, 162, 246; 156/643, 653; 357/23.1, 23.8, 54; 148/DIG. 131, DIG. 20

[56] References Cited

U.S. PATENT DOCUMENTS

| | | | |
|---|---|---|---|
| 3,496,428 | 2/1970 | De Volder | 437/192 |
| 3,664,896 | 5/1972 | Duncan | 357/59 |
| 3,667,008 | 5/1972 | Katnack | 357/59 |
| 3,833,842 | 9/1974 | Cunningham et al. | 437/192 |
| 3,881,242 | 5/1975 | Nuttall et al. | 359/59 |
| 3,900,944 | 8/1975 | Fuller et al. | 29/578 |
| 3,900,944 | 8/1975 | Fuller et al. | 437/192 |
| 3,906,540 | 9/1975 | Hollins | 148/DIG. 85 |
| 4,024,953 | 8/1977 | Hall | 437/792 |
| 4,063,967 | 12/1979 | Graul et al. | 357/59 |
| 4,096,510 | 6/1978 | Arai et al. | 357/59 |
| 4,102,733 | 6/1978 | De La Moneda et al. | 437/200 |
| 4,124,934 | 11/1979 | De Brebisson | 357/59 |
| 4,141,022 | 2/1979 | Sigg et al. | 437/41 |
| 4,146,413 | 3/1979 | Yonezawa et al. | 357/71 P |
| 4,157,269 | 6/1979 | Ning et al. | 437/41 |
| 4,188,707 | 2/1980 | Asano et al. | 148/DIG. 124 |
| 4,265,935 | 5/1981 | Hall | 437/192 |
| 4,267,012 | 5/1981 | Pierce et al. | 357/67 |
| 4,287,661 | 9/1981 | Stoffel | 29/571 |
| 4,343,082 | 8/1982 | Lepselter et al. | 437/41 |
| 4,356,040 | 10/1982 | Fu et al. | 437/189 |
| 4,531,144 | 7/1985 | Holmberg | 357/67 |

FOREIGN PATENT DOCUMENTS 56-111264 9/1981 Japan .
60-100464 6/1985 Japan .
2075255 11/1981 United Kingdom .

OTHER PUBLICATIONS

Shibata et al., *IEEE IEDM Technical Digest*, 1981, pp. 647-650.
Osburn et al., IBM Technical Disclosure Bulletin, vol. 24, No. 4, Sept. 1981, pp. 1970-1973.
Wittmer, M., "High-Temperature Contact Structures for Silicon Semiconductor Devices", *Appl. Phys. Lett.* 37(6), 15 Sept. 1980, pp. 540-542.
Lo, T. C., "Self Aligned Contact to a Doped Region", *IBM Tech. Disc. Bull.*, vol. 23, No. 7A, Dec. 1980, pp. 2780-2781.
Reith, T. M., et al., "Sl/Pts; Schottky Barrier Diodes with a Diffusion Barrier", *IBM Tech. Disc. Bull.*, vol. 16, No. 11, Apr. 1974, p. 3586.
Ku, S. M., "Ohmic Contacts for Small Shallow Structure Devices", *IBM Tech. Disc. Bull.*, vol. 22, No. 4, Sept. 1979, pp. 1487-1488.
Babcock, S. E., et al., "Titanium-Tungsten Contacts to Si...", *J. Appl. Phys.*, 53(10), Oct. 1982, pp. 6898-6904.
Olowolafe, J. O., et al., "Contact Reaction between Si and Pd.W Alloy Films", *J. Appl. Phys.*, 50(10), Oct. 1979, pp. 6316-6320.

*Primary Examiner*—Brian E. Hearn
*Assistant Examiner*—T. N. Quach
*Attorney, Agent, or Firm*—J. J. Connerton; Mark S. Walker; J. Jancin, Jr.

[57] ABSTRACT

A multi-layer contact process is described for providing contact to a shallow semiconductor region forming a semiconductor PN junction and with a silicon semiconductor body. The multi-layer structure includes a layer of polycrystalline silicon doped with an impurity of the same conductivity type as that of the semiconductor region. A first layer of a refractory alloy is deposited over the polycrystalline silicon layer to provide electrically stable interface therewith. A second layer of another refractory metal or alloy is deposited over the first refractory metal alloy layer and serves to protect the shallow PN junction against current leakage failure. A third layer of interconnect metal is deposited over the multi-layer contact structure. The resulting structure provides a low resistance ohmic contact to a shallow semiconductor region with improved electrical characteristics.

5 Claims, 4 Drawing Sheets

PROCESS FOR MAKING A CONTACT STRUCTURE INCLUDING POLYSILICON AND METAL ALLOYS

This is a division of application Ser. No. 06/419,677, filed on Sept. 20, 1982 now abandoned.

CROSS REFERENCE TO RELATED PATENT APPLICATION

Application Ser. No. 134,039 "Method for Making an Improved Polysilicon Conductor Structure Utilizing Reactive-Ion Etching and Thermal Oxidation" filed by Alex Stoffel, Mar. 26, 1980, now U.S. Pat. No. 4,287,661.

BACKGROUND OF THE INVENTION

The present invention relates to semiconductor devices, and relates in particular to an improved method for making ohmic contacts of stable electrical characteristics to shallow semiconductor regions thereof.

In semiconductor devices, such as insulated gate field effect transistors, the source and drain electrodes usually comprise a low melting point metal such as aluminum, which has been deposited on the surface of the source and drain regions making ohmic contact therewith. While aluminum may be satisfactory for this purpose in such devices that have relatively deep source and drain regions, i.e. depths greatly exceeding one micron, it has not proven satisfactory for making ohmic contact to source and drain regions which are very shallow, such as 0.5 micron or less in depth. Specifically, in fabricating the metal electrode, the aluminum is first deposited on the surface of the source and drain regions, and then subjected to a heat treatment at a temperature ranging from 400° C. to 500° C. to ensure an electrical connection. During this heat treatment, aluminum diffuses through the shallow depth of the semiconductor regions and thereby increase leakage current, and finally cause the underlying semiconductor junction to be short circuited. This destruction of the semiconductor junction is termed in the art "junction spiking".

The connection of metal electrode to a semiconductor region is generally performed by etching away an insulating layer, which protects the surface of a semiconductor body or substrate and a PN semiconductor junction reaching the surface at a predetermined location to form a contact window. Electrode material, such as aluminum, is then deposited on the surface of the semiconductor region through the contact window. The formation of the contact window in the insulating layer is provided in accordance with well-known lithographic techniques. The formation of the semiconductor region in the semiconductor body is provided by using a diffusion mask having windows at predetermined locations, which are also formed in accordance with lithographic techniques. Ideally, it is preferred that each contact window and diffusion window be precisely formed at predetermined locations with a specified size. However, because some misalignment of the mask patterns for forming the contact window and diffusion window is unavoidable, the contact window frequently exposes a portion of the semiconductor body. As a result, in forming the interconnecting layer, shortcircuiting of the underlying semiconductor junction occurs irrespective of junction spiking. These problems which are associated with mask misalignment are inherent to the lithographic techniques, and because of these problems, an increase in density of integrated circuit elements becomes difficult.

DESCRIPTION OF THE PRIOR ART

Certain methods for making contacts to shallow semiconductor regions have been proposed in the art to overcome the above-mentioned disadvantages, but none have proven satisfactory. In G.B. patent No. 2,075,255 issued Nov. 11, 1981 to Kawamata, a method for providing contacts to shallow semiconductor regions is described which includes forming a semiconductor layer of the same conductivity type as that of a semiconductor region on the portion of the semiconductor body exposed through a contact window in an insulating layer covering the surface of the semiconductor body, also forming a metal-semiconductor alloy layer electrically connected to the semiconductor layer described above. Therefore, even when the contact window exposes a portion of the semiconductor body as a result of mask misalignment, the portion exposed by the contact window is of the same conductivity type as that of the semiconductor region because of the presence of the semiconductor layer. Consequently, no shortcircuiting of the PN semiconductor junction by the interconnecting metal-semiconductor alloy layer takes place. However, while junction spiking may not occur during heat treating processes at a temperature range between 400° C. to 500° C., device failure by current leakage and junction spiking does occur at positively biased contacts.

Other methods for making an ohmic contact to a shallow semiconductor region have also been described in the art (see U.S. Pat. No. 3,906,540 issued Sept. 16, 1975 to Hollins and U.S. Pat. No. 4,141,022 issued Feb. 20, 1979 to Sigg et al.) which include depositing a first layer of a refractory metal, such as platinum, palladium or nickel, which form a silicide alloy with the silicon surface on which it is deposited, and then depositing a second layer of a refractory metal, such as molybdenum or titanium, on the refractory metal silicide layer. This second layer serves as a barrier to prevent the diffusion through the semiconductor regions of the subsequently deposited interconnect metal, such as aluminum. The problem with this solution for an ohmic contact to a shallow semiconductor region is that during the formation of the silicide alloy, a significant amount of silicon is consumed from the silicon substrate and, as a result, the depth of the semiconductor region and the dopant concentration therein are altered, thus resulting in adverse effects on device performance.

SUMMARY OF THE INVENTION

In accordance with the present invention, a method for fabricating an ohmic contact requires neither the formation of metal silicide nor the consumption of any significant amount of silicon from the silicon substrate and therefore differs from the method and structure of the above-noted prior art.

Accordingly, an object of the present invention is to provide an improved method for fabricating an electrically stable low resistance ohmic contact to a shallow semiconductor region, which result in improved electrical characteristics and increased yield for the resulting semiconductor devices. It is particularly desirable to provide a method which will improve the stability of a positively biased contact to a shallow semiconductor region. This improvement in the stability of the positively biased contact, in turn, improves the electrical characteristics and increase the yield of field effect integrated circuit structures.

In accordance with the present invention, there is also provided a semiconductor device comprising a semiconductor body or substrate having a major surface, a semiconductor region forming a shallow PN junction with the semiconductor body and reaching the major surface and an insulating layer overlying the major surface, the insulating layer having a contact window at which at least a portion of the semiconductor body is exposed as a result of mask misalignment and overetching of the insulating layer during the formation of the contact window A semiconductor layer having the same conductivity type as that of the semiconductor region is then formed on the exposed portion of the semiconductor body through the contact window, overlapping the edges of the contact window. A plurality of layers of refractory metals and alloys thereof are then formed over the semiconductor layer and an interconnecting layer of a metal having a low melting point as compared with the refractory metals or alloys thereof is formed on the upper surface of the above described structure.

In accordance with the present invention, there is also provided a method of fabricating a semiconductor device comprising the steps of providing a semiconductor body with a major surface, forming a semiconductor region comprising a shallow PN junction with the semiconductor body reaching the major surface, forming an insulating layer having a contact window which extends to the major surface and exposing at least a portion of the semiconductor body, forming a polycrystalline semiconductor layer over the semiconductor region and the exposed portion of the semiconductor body through the contact window overlapping the edges thereof, doping the semiconductor layer with an impurity of the same conductivity type as that of the semiconductor region, forming a plurality of layers of refractory metals and alloys thereof over the semiconductor layer and forming an interconnecting layer of a low melting point metal, such as aluminum, over the upper surface of the above described structure.

Preferably, the step of forming the layers of refractory metals and alloys thereof is performed by first forming a layer of a refractory metal alloy such as Ti/w (titanium/tungsten) comprising 10 to 30 percent by weight tungsten which serves to provide an electrically stable interface with the doped polycrystalline semiconductor layer. The first refractory metal alloy layer also serves to promote strong adhesion between the interconnecting aluminum layer and the doped polycrystalline semiconductor layer. A second layer of a refractory metal, such as tantalum (Ta), or tungsten (W) or a refractory metal alloy such as titanium/tungsten comprising at least 70 percent by weight tungsten is then formed on the first refractory metal alloy layer, and functions to prevent current leakage and junction spiking, particularly at positively biased contacts. Finally, since the method of the present invention requires neither the formation of metal silicide nor the consumption of any significant amount of silicon from the silicon substrate, a low resistance ohmic contact to a shallow semiconductor region is formed with improved electrical characteristics and increased manufacturing yield of the resulting semiconductor device.

The foregoing and other objects, features and advantages of the invention will be apparent from the following more particular description and preferred embodiment of the invention as illustrated in the accompanying drawings.

DESCRIPTION OF THE PREFERRED EMBODIMENT

Figure 1:
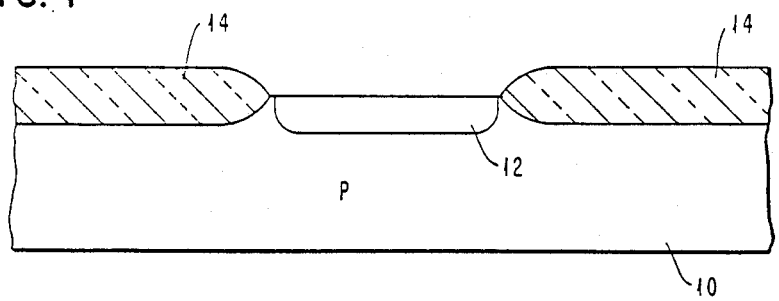
FIGS. 1 through 7 are cross-sectional views illustrating a sequence of process steps for fabricating a multilayer contact structure in accordance with the present invention.

Referring now to the drawings, FIGS. 1 through 7 illustrate an improved method for fabricating a low resistance ohmic contact to a semiconductor region forming a shallow PN junction in accordance with the present invention. Although the example described will be a multi-layer contact structure to an N-type region formed in a P-type silicon body or substrate, a contact structure to a P-type region formed in an N-type silicon substrate can be fabricated by simply doping the polycrystalline silicon layer with a P-type impurity.

As shown in FIG. 1, an N-type impurity such as arsenic is introduced into the P-type substrate structure of monocrystalline silicon 10 by having an impurity concentration of approximately $10^{15}$ atoms/cm$^3$ by ion implantation and a subsequent drive-in process to form N+ region 12, such as source and drain regions of an N-channel transistor, with a depth of 0.5 micron or less and an impurity concentration of approximately $10^{19}$ atoms/cm$^3$. The N+ region 12 is isolated from other integrated circuit devices by the recessed isolation regions 14. The recessed oxide regions 14 may be formed by any technique known in the art for fabricating such planar integrated circuit structures, e.g., the method described in the aforereferenced U.S. Pat. No. 4,287,661.

Figure 2:
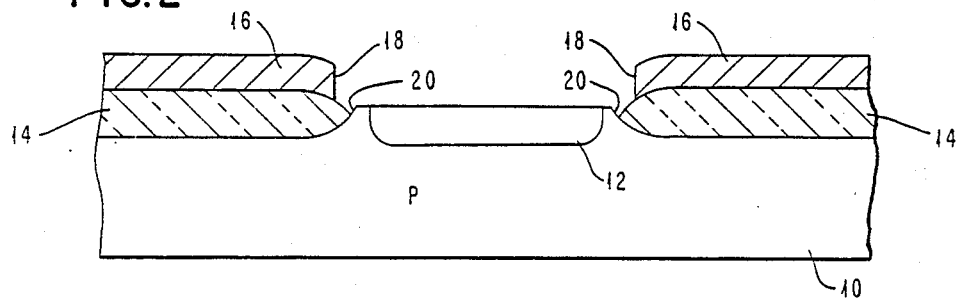

Next, as shown in FIG. 2, a silicon dioxide layer 16 with a thickness of approximately 5000 Angstroms is formed over the entire surface of the silicon substrate 10 including regions 14 by either thermal oxidation at about 1000° C. in a suitable oxygen, hydrogen chloride and steam atmosphere or chemical vapor deposition. A contact window 18 for providing interconnecting layers to be electrically connected to the N+ region 12 is then formed in the silicon dioxide layer 16 by conventional resist, lithography and etching techniques. As a result of mask misalignment and overetching of the silicon dioxide layer 16 during the formation of the contact window, inherent problems in lithographic techniques, the contact window 18 is not aligned with the N+ region 12, and therefore at least a portion 20 of the P-type silicon substrate 10 is exposed by the contact window 18. The resulting structure is shown in FIG. 2.

Figure 3:
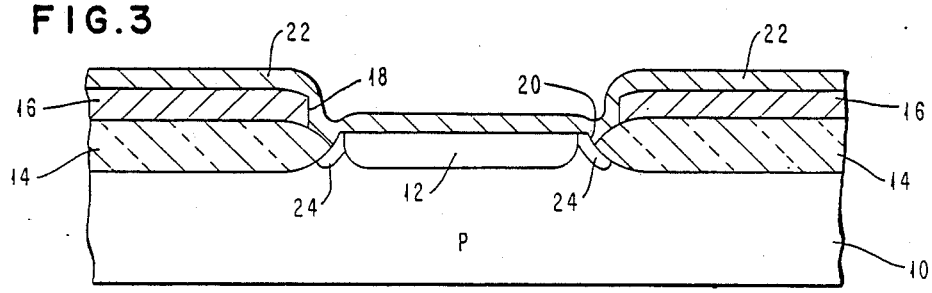

Referring to FIG. 3, a polycrystalline silicon layer 22 is deposited over the silicon dioxide layer 16 and into the contact windows 18 to interface with the exposed portions 20 of the P-type silicon substrate 10 within the contact windows by chemical vapor deposition, using silane in the temperature range of between about 600° to 1000° C. The preferred thickness of the polycrystalline silicon layer 22 is between about 3000 and 5000 Angstroms. The polycrystalline silicon layer 22 is then doped with an N-type impurity such as phosphorous by thermal diffusion or ion implantation, the preferred doping level varying between about $10^{19}$ and $10^{21}$ atoms/cm$^3$. By this step, the phosphorous dopants diffuse into the polycrystalline silicon layer 22 and are doped into the P-type silicon substrate 10 through the contact window 18, resulting in a formation of N+ regions 24 under the contact windows 18. Therefore, even if the contact windows 18 are not aligned with the N+ regions 12, the interconnecting layers to be formed do not cause a shortcircuit between the N+ region 12 and the P-type silicon substrate 10.

Figure 4:
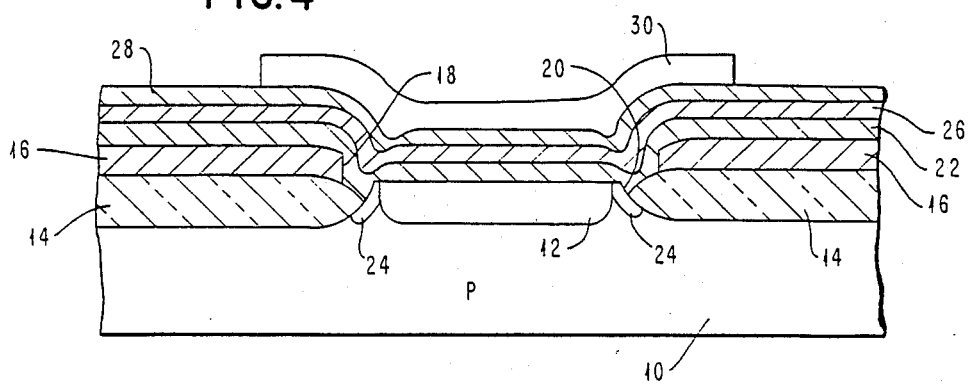

Referring now to FIG. 4, a layer 26 of a refractory metal alloy such as titanium/tungsten comprising 10 to 30 percent by weight tungsten and having a thickness of between about 500 and 2000 Angstroms is deposited over the polycrystalline silicon layer 22. Preferably, this will be done using RF sputtering. The addition of small concentrations of tungsten to the titanium serves to stabilize the electrical characteristics of the interface between layers 22 and 26 by effectively retarding the formation of metal silicides during the deposition of layer 26 and subsequent heat treating processes. As a result, substantially small amounts of silicon from the silicon substrate are consumed during the formation of the contact structure. Layer 26 also serves to promote strong adhesion between the interconnecting aluminum layer and the polycrystalline silicon layer 22. A top layer 26 is deposited a second layer 28 of another refractory metal or metal alloy such as tantalum, tungsten or titanium/tungsten comprising at least 70 percent by weight tungsten. Layer 28 is also deposited by RF sputtering, although, if tantalum is used, it may be deposited by evaporation. The preferred thickness of layer 28 is between about 500 and 2000 Angstroms. Layer 28 serves to protect the shallow PN junction against failure by current leakage and junction spiking, particularly at positively biased contacts. A layer 30 of a resist material having a thickness between 20,000 and 30,000 Angstroms is then deposited over refractory metal layer 28. Standard lithographic and masking techniques are utilized to provide a mask structure in the resist layer in areas lying directly above and slightly overlapping contact windows 18 where layers 22, 26 and 28 are desired. The resulting structure is shown in FIG. 4.

Figure 5:
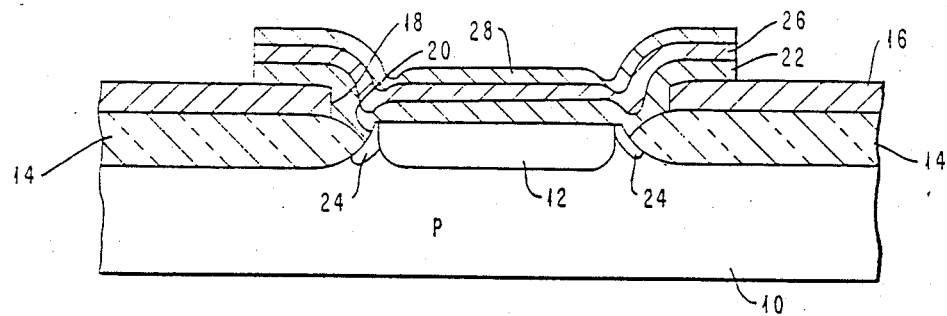

Referring now to FIG. 5, layers 22, 26 and 28 are removed using the remaining resist layer 30 as the mask, in undesired areas by suitable etching techniques. For example, if tantalum is used as refractory metal layer 28, it may be etched using techniques such as reactive ion etching or plasma etching in carbon tetrafluoride atmosphere. The titanium/tungsten layer 26 may be etched in hydrogen oxide ($H_2O_2$) at about 15° C. to 35° C. without chemically attacking the tantalum or silicon. The bottom N-type doped polycrystalline silicon layer 22 may also be etched using techniques such as reactive ion etching or plasma etching in a carbon tetrafluoride-hydrogen atmosphere. Thereafter, the remaining resist layer 30 is removed using conventional techniques.

Figure 6:
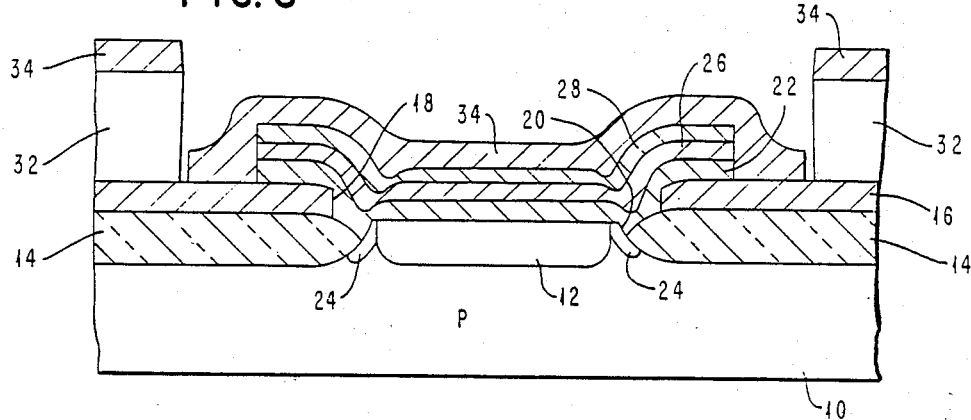

Referring now to FIG. 6, a second layer 32 of another resist material which will dissolve in n-methyl pyrolidone solution having a thickness of between 20,000 and 30,000 Angstroms is deposited over the entire surface of the silicon substrate 10. Conventional lithographic and masking techniques are then used to provide another mask structure in the second resist layer in areas where a layer of interconnect metal is not desired. A layer 34 of interconnect metal such as aluminum of between 10,000 and 15,000 Angstroms in thickness is then deposited over the entire surface of the silicon substrate 10, preferably by evaporation, as shown in FIG. 6. Thereafter, the portions of the deposited layer 34 on top of the remaining second resist layer 32 are removed by dissolving the second resist layer 32 in n-methyl pyrodone solution at a temperature of about 85° C., leaving an interconnection pattern which forms the conductive interconnection paths between devices and regions in the integrated circuit.

Figure 7:
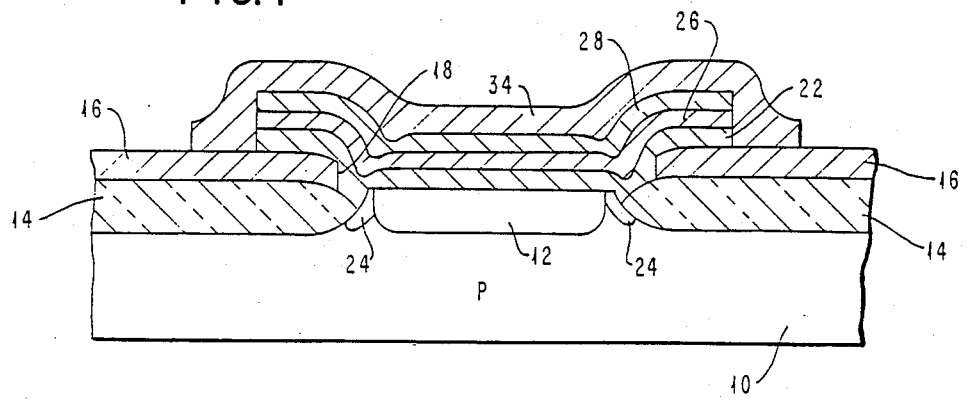
Figure 8:
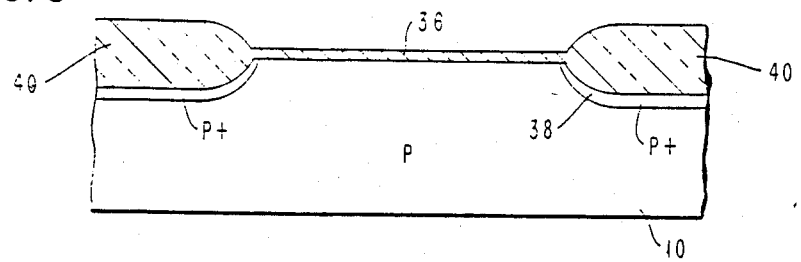
FIGS. 8 through 14 are cross-sectional views illustrating a sequence of process steps for fabricating insulated gate field effect transistors and a multi-layer contact structure in accordance with the present invention.

The final resulting structure is shown in FIG. 7. The FIG. 7 structure is then subjected to a sintering process at a temperature of at least 400° C. for at least 30 minutes to one hour. By this sintering step, good electrical connection between the interconnecting aluminum layer and the multi-layer contact structure is ensured.

Referring now to FIGS. 8 through 14, there is shown a method for fabricating an integrated circuit comprising insulated gate FET's (field effect transistors) and a multi-layer contact structure in accordance with the present invention. The embodiment herein described will be an N-channel transistor, although a P-channel transistor can be fabricated by simply reversing the P and N regions.

The P-type substrate structure of monocrystalline silicon 10 is thermally oxidized at about 1000° C. in a suitable oxygen and hydrogen chloride atmosphere to produce a silicon dioxide layer 36. A silicon nitride layer (not shown) is then deposited onto the silicon dioxide layer 36 by chemical vapor deposition, utilizing an ambient of nitrogen, dichorosilane and ammonia at a temperature of about 800° C. Conventional lithography processes are used to open the silicon substrate 10 through the silicon dioxide layer 36 and the silicon nitride layer, (not shown) in the regions where it is desired to have a recessed oxide isolation structure. The silicon dioxide layer 36 and the silicon nitride layer may be removed by conventional etching techniques such as chemical wet etching, reactive ion etching or plasma etching. A P-type impurity such as boron is introduced into the silicon substrate 10 by diffusion or ion implantation to form the P+ regions 38 in the areas where the recessed silicon dioxide isolation is desired. The recessed oxide isolation regions 40 are then formed in a suitable oxygen, hydrogen chloride and steam atmosphere at a temperature of about 950° C. The silicon nitride layer is removed to produce the structure shown in FIG. 8. The thickness of the recessed oxide regions varies between about 6,000 and 7,000 Angstroms. These recessed oxide regions 40 encircle regions of monocrystalline silicon wherein it is desired to form integrated circuit devices which are isolated from one another. The silicon dioxide layer 36 is completely removed at this point and the FIG. 8 structure is then subjected to a thermal oxidation using an ambient of oxygen, hydrogen chloride and steam at a temperature of about 800° C. to form the desired gate silicon dioxide layer 42 (FIG. 9) for the FET gate structure. This thermal oxidation process produces a substantially high quality silicon oxide.

Figure 9:
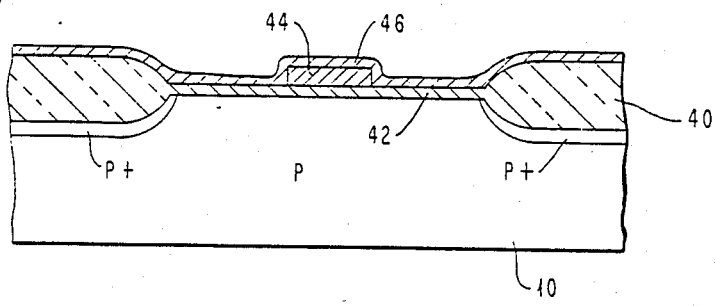

Referring to FIG. 9, a layer 44 of polycrystalline silicon is now deposited over the entire surface of the silicon substrate 10 including layers 40 and 42 by chemical vapor deposition, using silane in the temperature range of 600° C. to 1000° C. The polycrystalline silicon layer 44 is then doped with an N-type impurity such as phosphorous by thermal diffusion or ion implantation. Alternatively, the doping of the polycrystalline silicon layer 44 may be simultaneous with its deposition. The preferred thickness of the polycrystalline silicon layer is between about 3,000 and 5,000 Angstroms and the preferred doping level is between about $10^{19}$ to $10^{21}$ atoms/cm$^3$.

Next, a layer of a resist material (not shown) is deposited over the polycrystalline silicon layer 44. Standard lithographic and masking techniques are utilized to provide a mask structure in the resist layer in areas where the polycrystalline silicon gate electrode is desired. The resist layer is then utilized as a mask for the etching of the polycrystalline silicon layer 44 in unmasked areas. This etching is accomplished by directional or anisotropic reactive ion etching of the polycrystalline silicon in a carbon tetrafluoride-hydrogen atmosphere.

With respect to problems in the prior art solutions, the silicon dioxide layer is removed in the unmasked areas wherein it is desired to either ion implant or diffuse regions such as source and drain regions using a chemical wet etch. During this etching process, portions of the silicon dioxide layer under the edges of the polycrystalline silicon gate electrode are also removed. The resist layer is then removed and the surface of the silicon substrate is reoxidized by conventional thermal oxidation techniques to form a silicon dioxide layer over the source and drain regions. During this oxidation process, silicon dioxide of lower quality than the gate silicon dioxide layer is formed underneath the edges of the polycrystalline silicon gate electrodes. In addition, the edges of the polycrystalline silicon gate electrodes are found to be lifted by this oxidation process. These problems adversely affect the electrical characteristics of field effect transistor integrated circuit structures.

One possible solution for these problems has been described in the aforereferenced U.S. Pat. No. 4,287,661, FIG. 4, wherein the reactive ion etching of the polycrystalline silicon layer 30 in the unmasked areas is stopped when a thickness of polycrystalline silicon of the order of 500 Angstroms remains on the silicon dioxide layer 24. The resist layer is then removed and the structure is subjected to a thermal oxidation to convert the polycrystalline silicon in the unmasked areas to silicon dioxide. The sidewall of the polycrystalline silicon gate electrode 30 is also converted to silicon dioxide during this oxidation process. The silicon dioxide layer 34 and 24 are then etched anistropically by a reactive ion etching process down to the silicon substrate in regions where the source and drains are to be formed. Therefore, since no oxidation will occur at the gate silicon dioxide edges during subsequent oxidation, the quality of the gate silicon dioxide layer 24 is maintained at a high level. However, the problem with this method of fabrication is that the dimensions of the polycrystalline silicon gate electrode 30 and the channel length of FET's cannot be precisely controlled, resulting in adverse effects on the electrical characteristics of FET integrated circuit structures.

In accordance with the present invention and referring back to FIG. 9, the resist layer is removed following the reactive ion etching of the polycrystalline silicon layer 44 in unmasked areas. Thereafter, a silicon dioxide layer 46 of between about 1,000 and 2,000 Angstroms is deposited over the entire surface of the silicon substrate 10 by chemical vapor deposition, utilizing an ambient of dichorosilane and nitrogen oxide at a temperature of about 900° C.

Figure 10:
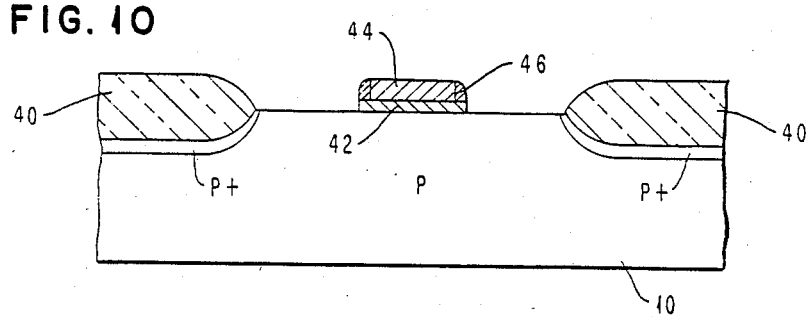

Referring now to FIG. 10, the layers 42 and 46 are etched anistropically by a reactive ion etching process down to the surface of the silicon substrate 10 in the desired source and drain regions. In the preferred embodiment illustrated in FIG. 10, the reactive ion etching for layers 42 and 46 utilizes the following parameters: A carbon tetraflouride-hydrogen atmosphere, an RF parallel plate structure, about 30 microns pressure, 0.27 watts/cm$^2$ power density, 7 cc/minute flow rate for hydrogen, and 13 cc/minute flow rate for carbon tetraflouride. During this etching process, the horizontal silicon dioxide layers 42 and 46 are removed, leaving the regions of the silicon dioxide layer 46 on the vertical sidewall regions of the polycrystalline silicon gate electrode 44 substantially intact. This then shields the gate silicon dioxide under the edges of the gate electrode during subsequent oxidation, thus maintaining the quality of the gate silicon dioxide 42 at a high level and provides significant improvement in controlling the dimensions of the gate electrode.

Figure 11:
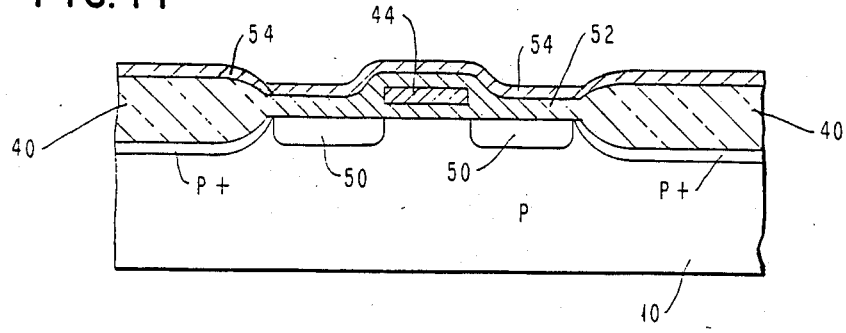

Referring to FIG. 11, an N-type impurity such as arsenic is introduced into the silicon substrate 10 by ion implantation and a subsequent drive-in process to form the source and drain N+ regions 50. The structure is then subjected to another thermal oxidation step utilizing an ambient of oxygen, hydrogen chloride and steam at a temperature of about 1000° C. to form a substantially high quality silicon dioxide layer 52 and also serve as the drive-in process. This is then followed by the deposition of silicon dioxide layer 54 by chemical vapor deposition. The combined thicknesses of the silicon dioxide layers 52 and 54 is of the order of 5,000 Angstroms. FIG. 11 shows the resulting structure.

Figure 12:
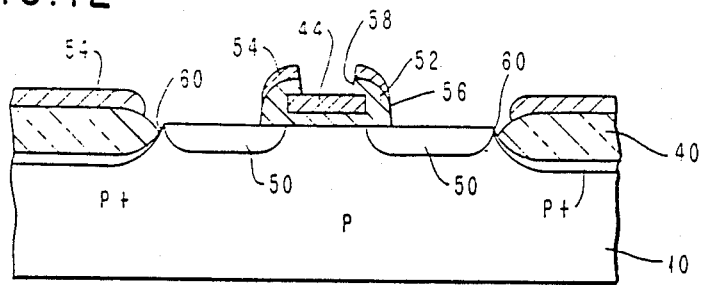

The next step in the process, shown in FIG. 12, comprises forming contact windows 56 and 58 in the silicon dioxide layers 52 and 54 to define contact areas for providing interconnecting layers to be electrically connected to the source and drain N+ regions 50 and the polycrystalline silicon gate electrode 44 respectively. The contact windows 56 and 58 are formed in accordance with well-known resist, lithography and etching techniques. As a result of mask misalignment and overetching of the silicon dioxide layers 52 and 54 during the formation of the contact windows, the contact windows are not aligned with the source and drain N+ regions 50. Furthermore, a portion of the recessed silicon dioxide 40 is also removed during the etching of the silicon dioxide layers 52 and 54 to form the contact windows. Therefore, at least portions 60 of the P-type silicon substrate 10 are exposed by the contact windows, as shown in FIG. 12.

Figure 13:
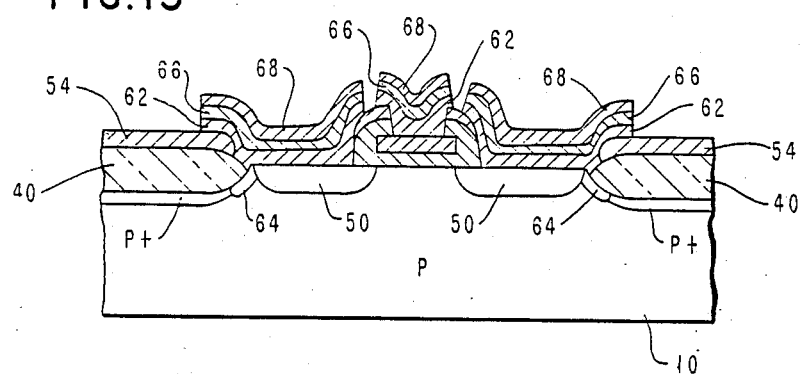

Referring now to FIG. 13, a polycrystalline silicon layer 62 is deposited over the entire surface of the silicon substrate 10 and into contact windows 56 and 58 to interface with the exposed portions 60 of the P-type silicon substrate 10 by chemical vapor deposition. The preferred thickness of the polycrystalline silicon layer 62 varies between about 3,000 and 5,000 Angstroms. The polycrystalline silicon layer 62 is then doped with an N-type impurity such as phosphorous by thermal diffusion or ion implantation. During this latter step, the phosphorous dopants diffuse into the polycrystalline silicon layer 62 and are doped into the P-type silicon substrate 10 through the contact windows 56, resulting in the formation of N+ regions 64 under the contact windows 56. Consequently, shortcircuiting of the PN junction by the interconnecting layers to be deposited does not take place. A layer 66 of a refractory metal alloy such as titanium/tungsten comprising 10 to 30 percent by weight tungsten and having a thickness of between about 500 and 2,000 Angstroms is then deposited over the polycrystalline silicon layer 62, preferably by RF sputtering. A top layer 66 is deposited a second layer 68 of another refractory metal or metal alloy such as tantalum, tungsten or titanium/tungsten comprising at least 70 weight percent tungsten, preferably by RF sputtering. However, tantalum, if used, may be deposited by evaporation. The preferred thickness of layer 68 is between about 500 and 2,000 Angstroms. A layer of a resist material (not shown) is then deposited over layer 68 and standard lithographic and masking techniques are utilized to provide a mask structure in the resist layer in areas lying directly above and slightly overlapping contact windows 56 and 58 where layers 62, 66 and 68 are desired. Layers 62, 66 and 68 are removed using the resist layer as the mask, in undesired areas by suitable etching techniques. The resist layer (not shown) is then removed using conventional techniques.

Figure 14:
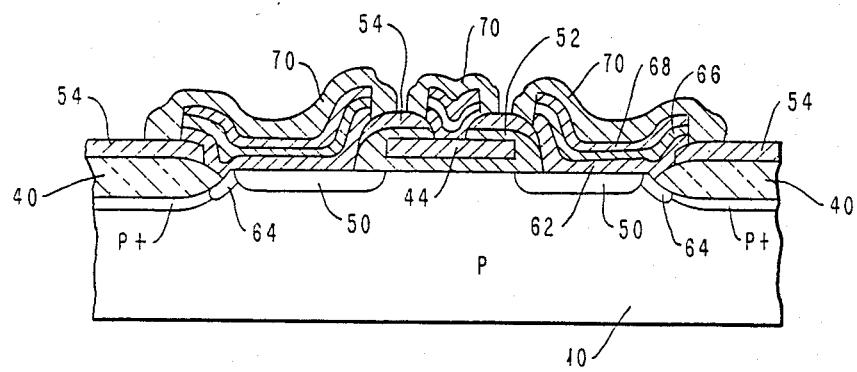

Referring now to FIG. 14, the next step of processing includes depositing a second layer of another resist material (not shown) which may be dissolved in n-methyl pyrolidone solution over the entire surface of the silicon substrate 10 including layers 54 and 68. Standard lithographic and masking techniques are then utilized to provide another mask structure in the second resist layer in areas where a layer of interconnect metal is not desired. A layer 70 of interconnect metal such as aluminum is then deposited over the surface of the silicon substrate including layer 68 as well as the remaining resist layer (not shown) by evaporation. Thereafter, the portions of the deposited layer 70 on top of the remaining resist layer are removed by dissolving the second resist layer in an n-methyl pyrolidone solution at a temperature of about 85° C. leaving an interconnection pattern which forms the conductive interconnection paths between devices and regions in the integrated circuit.

The structure is next subjected to a sintering process at a temperature of at least 400° C. for a period of 30 minutes to one hour to ensure good electrical connection between the interconnecting aluminum layer and the multi-layer contact structure. Thus, through the sequence of the process steps as defined above, an improved method for making a low resistance ohmic contact to a semiconductor region forming a shallow PN junction has been described.

While the invention has been particularly shown and described with reference to a preferred embodiment thereof, it will be understood by those skilled in the art that various changes in form and detail may be made therein without departing from the spirit and scope of the invention.

Having thus described our invention, what we claim as new, and desire to secure by Letters Patent is:

1. A method of fabricating a field effect transistor integrated circuit structure wherein a layer of polycrystalline silicon is formed over a silicon body covered by a first layer of silicon dioxide, said polycrystalline silicon layer being masked in areas where a gate electrode is desired and etched in unmasked areas of said polycrystalline silicon, comprising the steps of:
    forming a second layer of silicon dioxide over said masked and unmasked areas,
    selectively etching said first and second silicon dioxide layers for exposing source and drain regions adjacent said gate electrode,
    doping said exposed source and drain regions with a dopant,
    forming a third layer of silicon dioxide over said source and drain regions and said gate electrode,
    forming contact windows to said gate electrode, said source and drain regions, and said silicon body, wherein said contact window to said source and drain regions also expose portions of said silicon body,
    forming a polycrystalline silicon layer over said gate electrode, said source and drain regions, and said exposed portions of said silicon body, wherein said polycrystalline silicon layer contacts exposed regions of said gate electrode, said source and drain regions, and said silicon body,
    doping said polycrystalline silicon layer with an impurity, diffusing said impurity into said polycrystalline silicon layer and into said silicon body,
    depositing a first refractory metal alloy layer over said polycrystalline silicon layer, said refractory metal alloy layer comprising approximately 10 to 30 percent by weight Tungsten,
    depositing a second refractory metal alloy layer over said first refractory metal alloy layer, said second refractory metal alloy layer comprising at least 70 percent by weight Tungsten,
    depositing an interconnect metal layer over said refractory metal alloy layers and,
    heating said integrated circuit structure to a temperature of at least approximately 400 degrees Celsius but less than a temperature required to form a metallic silicide layer comprising silicon from either said polysilicon layer or said silicon body.

2. A method of fabricating a field effect transistor as in claim 1 wherein:
    an N-type dopant, dopes said exposed source and drain regions.

3. A method of fabricating a field effect transistor as in claim 1 wherein:
    an N-type impurity dopes said polycrystalline silicon layer.

4. A method of fabricating a field effect transistor as in claim 1 wherein:
    a P-type dopant, dopes said exposed source and drain regions.

5. A method of fabricating a field effect transistor as in claim 1 wherein:
    a P-type impurity dopes said polycrystalline silicon layer.

* * * * *